United States Patent [19]
Miller et al.

[11] Patent Number: 5,500,789
[45] Date of Patent: Mar. 19, 1996

[54] PRINTED CIRCUIT BOARD EMI SHIELDING APPARATUS AND ASSOCIATED METHODS

[75] Inventors: Kevin L. Miller, Austin; Robert L. McMahan, Cedar Park; Todd W. Steigerwald, Austin, all of Tex.

[73] Assignee: Dell USA, L.P., Austin, Tex.

[21] Appl. No.: 354,344

[22] Filed: Dec. 12, 1994

[51] Int. Cl.⁶ .................................................. H05K 9/00
[52] U.S. Cl. .................. 361/816; 361/800; 361/818; 174/35 R; 439/108; 257/659
[58] Field of Search ................... 361/816, 752, 361/796, 800, 818; 174/35 R, 52.4; 439/108, 109; 333/246, 247; 257/659

[56] References Cited

U.S. PATENT DOCUMENTS

| | | | |
|---|---|---|---|
| 5,101,322 | 3/1992 | Ghaem et al. | 361/386 |
| 5,317,107 | 5/1994 | Osorio | 174/52.4 |
| 5,341,274 | 8/1994 | Nakatani et al. | 361/818 |

*Primary Examiner*—Leo P. Picard
*Assistant Examiner*—Y. Whang
*Attorney, Agent, or Firm*—Henry Garrana; Michelle Turner

[57] ABSTRACT

Transverse electromagnetic mode (TEM) radiation emitted from a side edge portion of a circuit board substrate portion during operation of the circuit board is intercepted by a specially designed shield structure carried by the substrate side edge portion, and the intercepted radiation is conductively returned to the substrate ground plane, through a relatively short grounding path, for return to the emitting source(s). In one form thereof, the shield is a copper plating material extending along and covering the substrate side edge portion and adjacent peripheral portions of the opposite sides of the substrate. In another form thereof, the shield is a snap-on metal shield structure that is removably mounted around the substrate side edge portion. The shield may be electrically coupled to the substrate ground plane by directly contacting a ground plane edge portion with the copper plating, using a filter structure to couple the shield to the ground plane, or otherwise using an external grounding path. When the shield is formed by using a copper plating, the shield may also be used as a grounding connection by sliding it into a metal chassis support rail structure. The grounding connection may be improved by covering opposites side portions of the copper plating shield with a masking material having spaced series of holes therein, and then filling the holes with a solder material that forms solder bumps projecting outwardly beyond the outer sides of the masking material.

20 Claims, 4 Drawing Sheets

PRINTED CIRCUIT BOARD EMI SHIELDING APPARATUS AND ASSOCIATED METHODS

BACKGROUND OF THE INVENTION

The present invention generally relates to printed circuit board apparatus, and more particularly relates to apparatus and methods for shielding EMI radiation generated by a printed circuit board during operation thereof.

Printed circuit boards used in various types of computers are mounted within a plastic housing structure. During operation of the circuit board electromagnetic interference (EMI) radiation is generated within the board, emanates therefrom, and must be substantially prevented from escaping outwardly through the housing structure. To provide the housing with the necessary EMI radiation shield the interior of the housing is typically coated with a metallic material which is appropriately brought into contact with a grounding portion of the electronics, such as the ground plane of the circuit board disposed within the housing. Other types of EMI shields positioned in a spaced apart location from the circuit board may be alternatively utilized.

A primary source of EMI radiation generated by a circuit board during its operation is commonly referred to as transverse electromagnetic mode (TEM) radiation. TEM radiation is created primarily by the alternating clock current transmitted through the circuit board traces, and the instantaneous current changes in the electronic board components such as chips, and is manifested as a generally wave-shaped mutual inductance disturbance between the spaced apart ground plane and power plane portions of the circuit board disposed within its dielectric substrate member.

The TEM wave effect can account for up to about seventy five percent of the total EMI interference generated by the operating circuit board, and creates EMI radiation that is discharged from the edge periphery of the board substrate in a generally parabolic pattern. TEM radiation discharged from the peripheral edge of the substrate in this manner strikes the remote EMI shield structure. A first portion of the received radiation is absorbed by the shield structure; a second portion of the received radiation is inwardly reflected by the shield structure; and the balance of the received radiation is conducted by the shield structure back to the circuit board ground plane, and then to the emitting component, via a grounding connection interconnected between the ground plane and the remote shield structure.

The remote EMI shield structure creates with the ground plane of the circuit board an RF loop around which the TEM radiation, and other types of EMI radiation, pass from and back to the radiation emitting component via the ground plane. The radiation shielding efficiency of this RF loop is generally proportional to its effective length. In the conventional circuit board/housing EMI shield structure generally described above, this loop is relatively correspondingly diminished. AAccordingly, the its overall EMI shielding efficiency is correspondingly diminished.

Another disadvantage associated with this conventional EMI shielding technique is that it typically requires a number of midboard mounting holes for board-to-shield grounding purposes. This requirement can add considerably to the complexity of routing conductive traces along the substrate since the traces must be diverted around the mounting holes.

As can readily be seen from the foregoing, it would be highly desirable to provide a housing-enclosed printed circuit board with improved apparatus and associated methods for electrically grounding the board and shielding the TEM radiation emitted by the board during the operation thereof. It is accordingly an object of the present invention to provide such improved apparatus and methods.

SUMMARY OF THE INVENTION

In carrying out principles of the present invention, in accordance with a preferred embodiment thereof, an improved method is provided for shielding transverse electromagnetic mode (TEM) radiation being emitted from a side edge portion of a circuit board substrate member having a ground plane disposed therein and extending parallel to first and second opposite sides thereof. From a broad standpoint the method comprises the steps of supporting an electrically conductive radiation shield structure on the substrate member, the supported radiation shield structure having a body portion disposed in a facing, adjacent relationship with the substrate member side edge portion to intercept transverse electromagnetic mode radiation emitted therefrom, and grounding the shield structure-body portion to the substrate member ground plane to conductively return the intercepted radiation to the ground plane.

In one shielded circuit board apparatus embodying principles of the present invention, the radiation shield structure is defined by a metallic coating, preferably a copper coating, extending outwardly along and covering the substrate side edge portion and peripheral portions of the opposite substrate sides adjacent the side edge portion. The grounding of the shield structure to the substrate ground plane is effected by extending an edge portion of the ground plane outwardly through the substrate side edge portion into direct engagement with the copper plating material.

In a second shielded circuit board apparatus embodying principles of the present invention, the radiation shield structure is a metallic coating, and the substrate ground plane stops short of the substrate side edge portion upon which the shield is disposed. The electrical coupling of the shield to the ground plane is effected by a solder-lined via extending through the substrate, engaged with the ground plane, and coupled with the shield structure through an electrical filter structure mounted on one of the sides of the substrate.

In a third shielded circuit board apparatus embodying principles of the present invention, the radiation shield structure is a metallic coating, and the substrate ground plane stops short of the substrate side edge portion upon which the shield is disposed. The electrical coupling of the shield to the ground plane is effected by inserting the plated edge portion of the circuit board substrate into a support channel portion of a metal chassis. A metal mounting screw is threaded through a solder-lined via, extending through the substrate and engaging the ground plane, and into a boss portion of the chassis to thereby ground the shield to the substrate ground plane.

In a fourth shielded circuit board apparatus embodying principles of the present invention, the radiation shield structure is a metallic coating, and the substrate ground plane stops short of the substrate side edge portion upon which the shield is disposed. Masking material is exteriorly placed on the opposite side sections of the metallic coating that extend along the opposite sides of the substrate. The masking material portions have spaced series of holes disposed therein and filled with solder that contacts the underlying metallic coating and forms solder bumps that project outwardly beyond the outer sides of the masking material portions. The masking material covers and protects the opposite side sections of the metallic coating from corrosion, and a suitable external grounding path may be formed between the solder bumps and the substrate ground plane.

In a fifth shielded circuit board apparatus embodying principles of the present invention, the shield portion of the apparatus is a separate resilient metal shield apparatus having a body portion with opposite side edge sections extending generally transversely thereto. Spaced pairs of electrically conductive ground runner structures are mounted on opposite sides of the substrate member adjacent and parallel to its side edge portion The ground runner structures are electrically coupled to the ground plane by solder-lined vias extending through the substrate and engaging the ground plane and the runner structures. The shield structure is removably mounted on the substrate, in a manner positioning the shield body portion in an outwardly spaced, facing relationship with the side edge portion of the substrate member, by simply snapping the side edge sections of the shield structure into the opposite pairs of ground runner structures to thereby electrically couple the shield structure to the substrate member ground plane.

In each case, the shield structure carried by the substrate member intercepts the TEM radiation emitted from the substrate member side edge portion, at a location adjacent the side edge portion, and efficiently conducts the intercepted radiation back to the substrate member ground plane, for return to the emitting source(s), via a relatively short grounding path, thereby desirably lessening the overall path length of the RF shielding loop.

DETAILED DESCRIPTION

Figure 1:
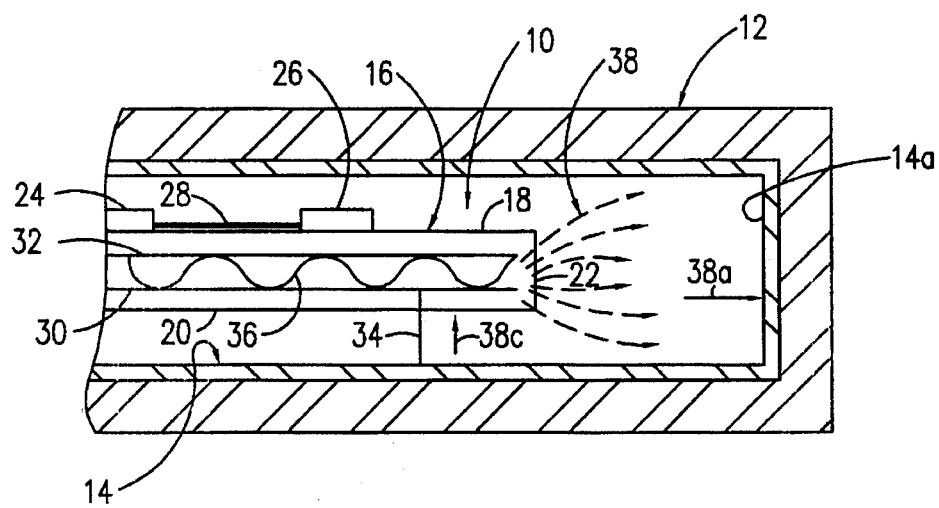
FIG. 1 (Prior Art) is a schematic cross-sectional view through a portion of a conventionally constructed printed circuit board disposed within an internally shielded housing structure and generating transverse electromagnetic mode (TEM) radiation from a side edge portion of the board substrate.

Schematically illustrated in cross-section in FIG. 1 (Prior Art) is a portion of a conventionally constructed printed circuit board 10 operatively mounted within a plastic housing 12 interiorly lined with a metallic material serving as a shield 14 for EMI radiation emitted by the circuit board 10 during operation thereof. The circuit board 10 includes a dielectric substrate portion 16 having a generally rectangular configuration, opposite top and bottom sides 18 and 20, and a peripheral side edge portion 22 extending between the top and bottom sides 18,20 and disposed in a spaced apart, facing relationship with a vertically extending portion 14a of the remote EMI shield 14.

A spaced series of electrical components, including components 24 and 26, are operatively mounted on the top side 18 of the substrate 16 and are electrically coupled by surface traces 28 extending along the top substrate side 18. Disposed within the interior of the substrate 16 are a ground plane 30 and a power plane 32. The spaced apart ground and power planes 30,32 are in a parallel relationship with one another, are parallel to the top and bottom substrate sides 18 and 20, and stop short of the substrate side edge portion 22. As schematically depicted by the line 34, the EMI shield structure 14 is electrically coupled to the ground plane 30.

During operation of the circuit board 16, a mutual inductance disturbance is created between the ground and power planes 30,32 in the form of a transverse electronic mode (TEM) wave pattern 36. The TEM wave 36 emits electromagnetic interference (EMI) radiation 38 from the substrate edge portion 22, as well as from adjacent peripheral portions of the substrate sides 18 and 20, toward the vertical EMI shield portion 14a in a generally parabolic pattern as schematically indicated in FIG. 1. Similar TEM wave—generated radiation patterns are simultaneously emitted from the other three side edge portions of the substrate 16.

A first portion 38a of the emitted radiation 38 is absorbed by the EMI shield 14; a second portion 38b of the emitted radiation 38 is inwardly reflected from the EMI shield 14; and most of the balance 38c of the emitted radiation 38 is conducted through the metallic EMI shield 14 back to the ground plane 30 via the ground path 34. As can be seen, the interior of the housing 12, the EMI shield 14, and the ground path 34 combinatively form an RF loop through which TEM radiation 38 emitted from the edge periphery of the substrate 16 is returned to the emitting source(s) via the ground plane 30. It can also be seen that this RF loop is relatively lengthy and thus somewhat inefficient in returning the emitted radiation energy back to the circuit board emitting source(s).

Figure 2:
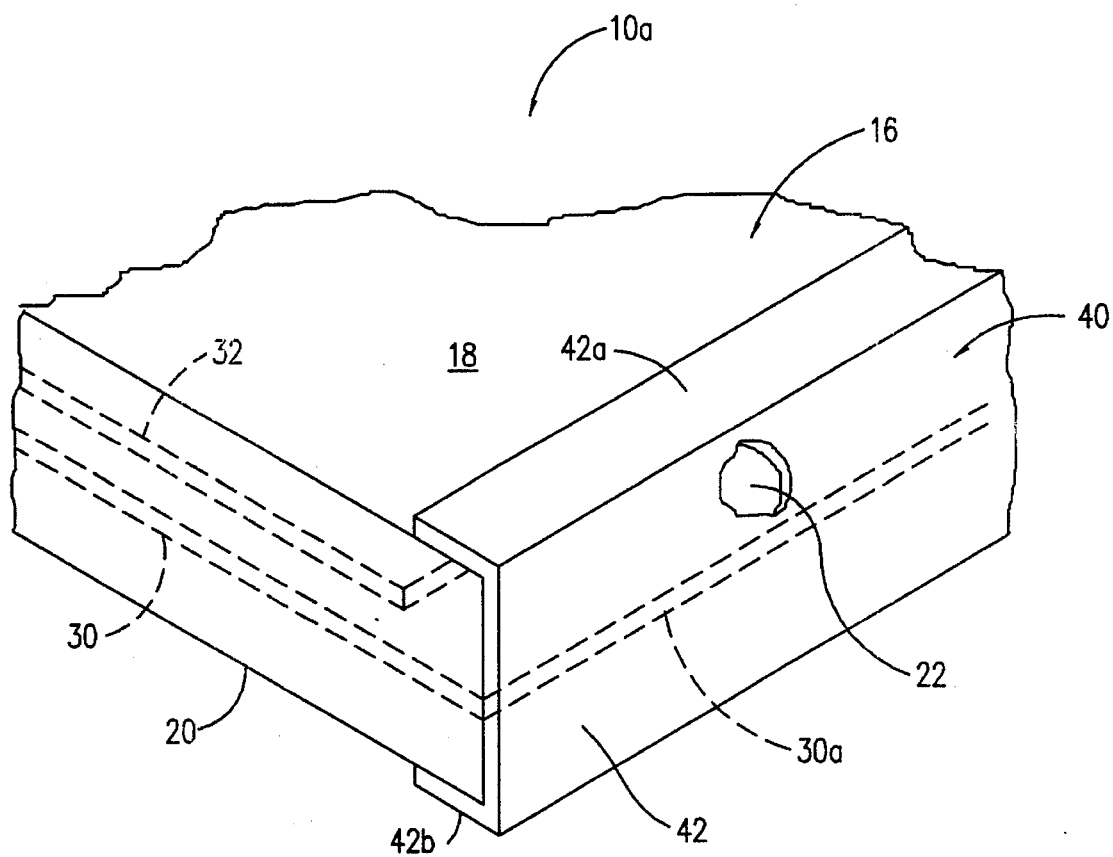
FIG. 2 is a simplified, partially cut away perspective view of a portion of a printed circuit board provided along a substrate member side edge thereof with a specially designed TEM radiation held structure embodying principles of the present invention.

A modified circuit board 10a is shown in FIG. 2 as being provided with a specially designed TEM shield structure 40 that embodies principles of the present invention and serves as a physical barrier to the emission of TEM wave radiation from the substrate side edge portion 22 as well as forming a portion of an RF loop for returning emitted TEM, wave radiation to its emitting source through a considerably shorter, and thus more efficient, path. In the embodiment thereof illustrated in FIG. 2, the TEM shield structure comprises a layer of copper plating having a base portion 42 disposed on and covering the board substrate edge portion 22 and preferably having, along its top and bottom side edge portions, transverse extension sections 42a,42b that extend along and cover peripheral portions of the top and bottom substrate sides 18,20 respectively adjacent the copper plating base portion 42.

As illustrated, in forming the circuit board 10a an edge 30a of the ground plane 30 is carried clear to the substrate side edge portion. Accordingly, when the copper plating is applied to the illustrated substrate edge portion, the ground plane edge 30a conductively engages the copper plating base portion 42, thereby directly grounding the TEM shield structure 40 to the circuit board ground plane 30. During operation of the circuit board 10a, TEM wave radiation generated between the ground and power planes 30,32 is physically blocked directly at its former emanation locations along the right edge of the board—namely, the substrate side edge 22 and adjacent peripheral portions of the substrate sides 18,20. Additionally, the TEM shield structure 40 desirably forms a very short conductive path for the TEM radiation directly back to the ground plane 30.

Figure 3:
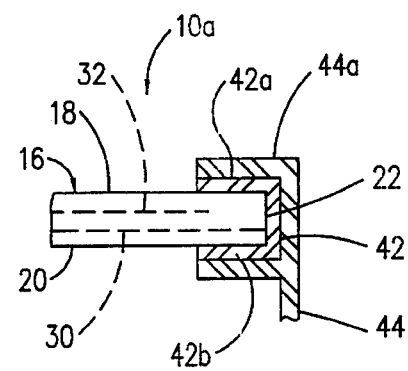
FIG. 3 is a schematic cross-sectional view through the shielded substrate side edge portion of the FIG. 2 circuit board illustrating its slide-in mounting and grounding within a representative metal chassis support channel.

The TEM shield structure 40 also functions as a mounting and grounding structure for the circuit board 10a as schematically depicted in FIG. 3. By simply sliding the TEM shield edge portion of the circuit board 10a into an appropriate, generally U-shaped mounting channel portion 44a of a sheet metal chassis structure 44, the ground plane 30 of the circuit board 10 is automatically grounded to the chassis 44 without the need for mounting screws and the usual solder-lined mounting vias extending through the substrate portion of the circuit board.

Figure 2A:
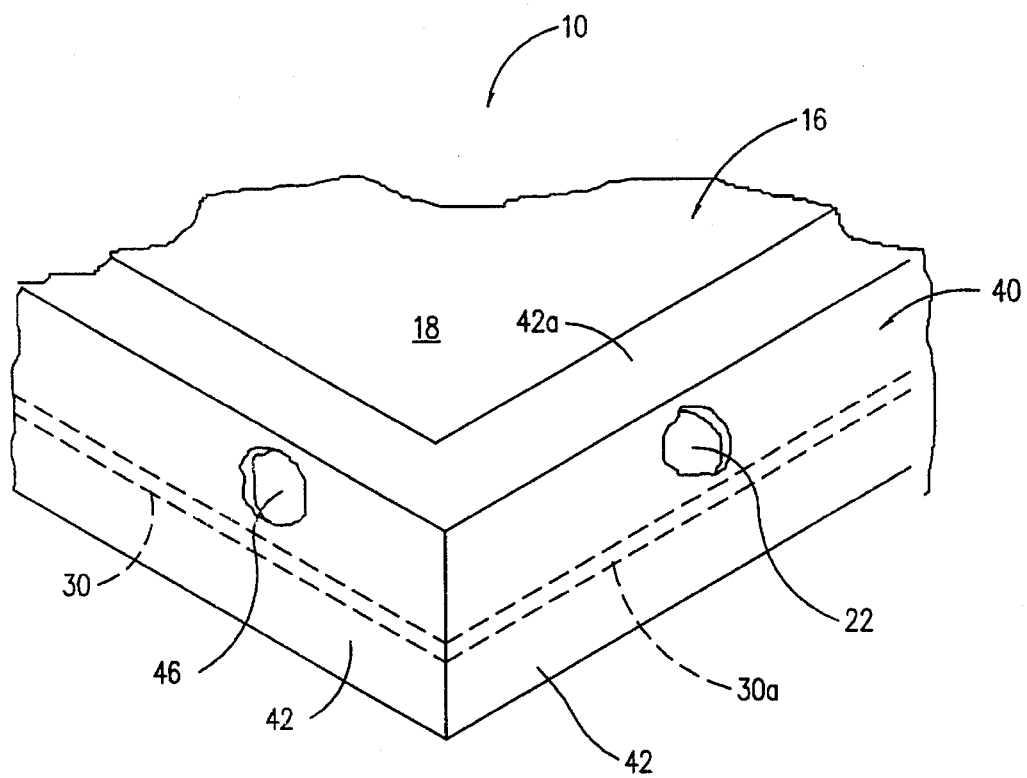
FIG. 2A is a view similar to that in FIG. 2 illustrating the TEM radiation shield structure additionally extending along a second sedge of the board substrate member.

While the TEM shield structure 40 has been representatively illustrated in FIG. 2 as extending along only a single substrate side edge 22, it will be readily appreciated by those of skill in this particular art that the shield structure 40 may be placed on one, two, three, or all four side edges of the board substrate depending on the EMI shielding requirements of the particular circuit board application. For example, as shown in FIG. 2A, the TEM shield structure 40 may be wrapped around from the substrate side edge 22 onto and along the entire length of an adjacent substrate side edge 46 to directly shield two side edges of the substrate 16.

Figure 5:
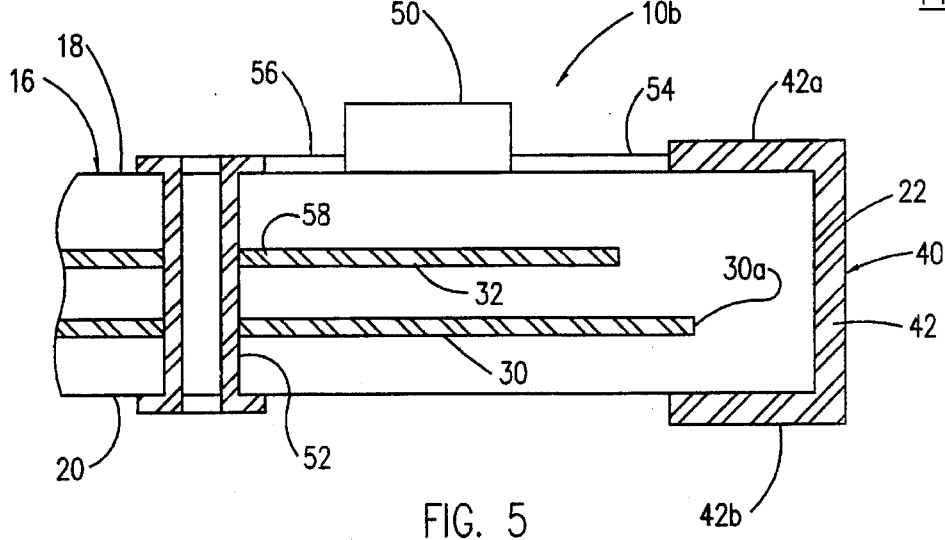
FIG. 5 is a simplified partial cross-sectional view through a first alternate embodiment of the edge-shielded printed circuit board.
Figure 4:
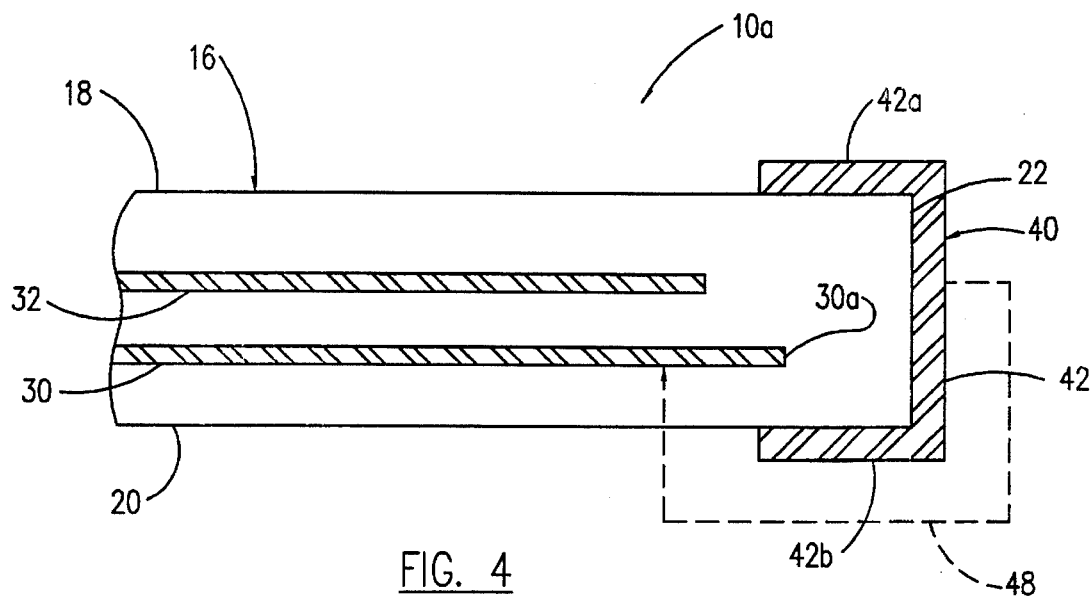
FIG. 4 is a simplified partial cross-sectional view through an edge-shielded printed circuit board schematically illustrating an external grounding path between its TEM radiation shield structure and its ground plane.

Referring now to FIG. 4, as an alternate to grounding the TEM shield structure 42 directly to the ground plane side edge 30a of the circuit board 10a, the ground plane side edge 30a may be stopped short of the substrate side edge 22 and the TEM shield structure 40 electrically coupled to the ground plane 30 via an external grounding path schematically depicted by the dashed line 48. One method of providing this external grounding path is shown in conjunction with the circuit board 10b of FIG. 5 which represents a first alternate embodiment of the previously described circuit board 10a. In the circuit board 10b, an electrical filter 50 is mounted on the top side 18 of the board substrate 16 and is coupled between the shield portion 42a and the upper end of a solder-lined via 52 extending transversely through the substrate 16 by electrically conductive surface traces 54,56 formed on the top substrate side 18. Via 52 extends centrally through a larger diameter hole 58 in the power plane 32 (and thus does not conductively contact the power plane), and conductively engages the ground plane 30 as shown.

In this embodiment of a TEM-shielded circuit board, the TEM shield 40 is isolated from the TEM wave between the ground and power planes 30,32 so that the TEM shield is not part of the oscillating wave source. It is hypothesized that in certain EMI shielding applications this will improve the shielding efficiency of the TEM shield structure 40.

Figure 6:
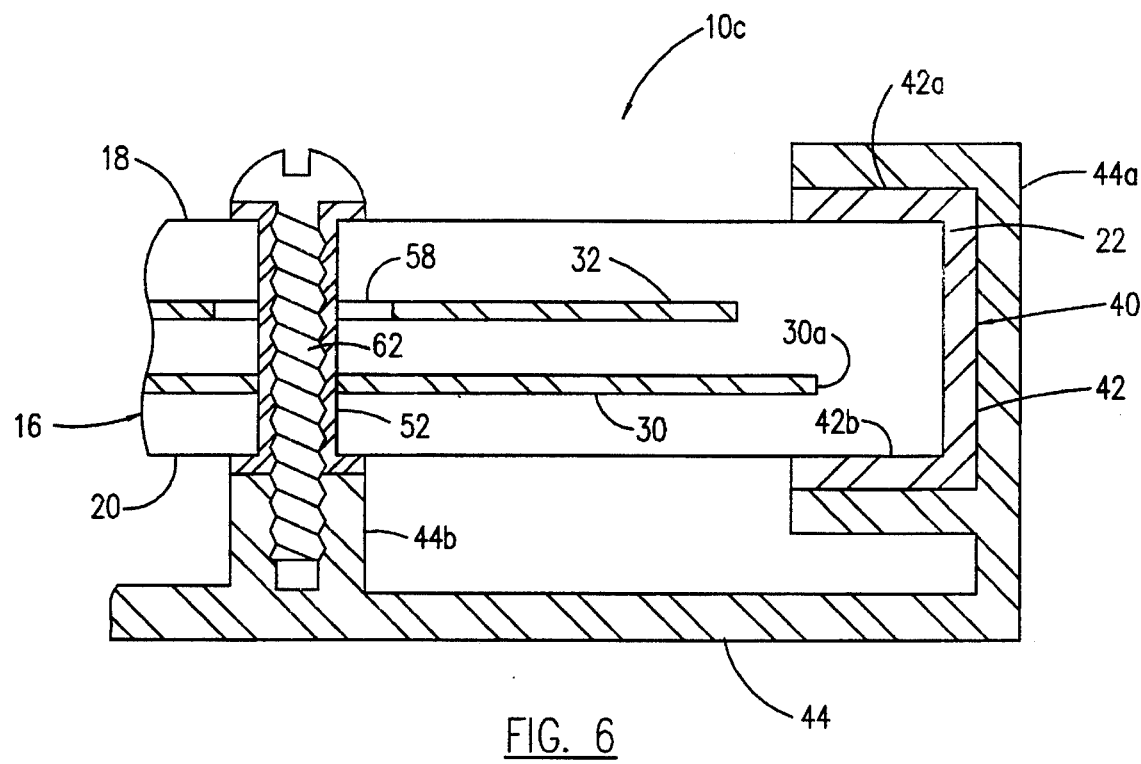
FIG. 6 is a simplified partial cross-sectional view through a second alternate embodiment of the edge-shielded printed circuit board.

The second alternate circuit board embodiment 10c shown in FIG. 6 illustrates another method of providing an external grounding path between the TEM shield structure 40 on the substrate side edge 22 and the ground plane 30 whose edge portion 30a stops short of the substrate side edge 22. Specifically, the shielded substrate edge portion is inserted into a support channel portion 44a of a sheet metal chassis having a boss portion 44b. A solder-lined via 52 extends transversely through the substrate 16, overlies the boss portion 44b, and is in electrical contact with the ground plane 30 but not the power plane 32. A metal mounting screw 60 is threaded downwardly through the via 52, and into the chassis boss portion 44b, to complete the ground path between the TEM shield structure 40 and the ground plane 30.

Figure 7:
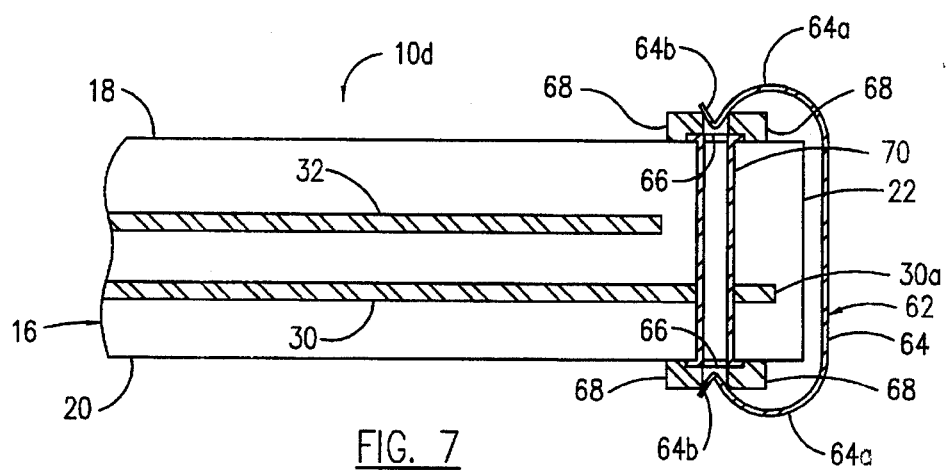
FIG. 7 is a simplified partial cross-sectional view through a third alternate embodiment of the edge-shielded printed circuit board.

A third alternate embodiment 10d of the previously described TEM-shielded circuit board 10a is shown in FIG. 7 and features a snap-on TEM shield structure 62 that is used in place of its copper plating of the substrate side edge 22 and adjacent peripheral portions of the top and bottom substrate sides 18,20. The snap-on TEM shield structure 62 is formed from a suitable metal material, such as copper, and has a flat body portion 64 that extends generally parallel to the substrate side edge 22, in an outwardly spaced relationship therewith, along its entire length. Top and bottom side portions 64a of the TEM shield body 64 are bent toward one another as shown, and have outwardly bent peripheral portions 64b.

The peripheral shield portions 64b resiliently and releasably snap into spaces 66 disposed between pairs of elongated copper ground runner bar structures 68 that longitudinally extend parallel to and adjacent the substrate side edge 22. Bar structures 68 conductively engage the shield portions 64 and also conductively engage the top and bottom ends of a spaced series of solder-lined vias 70 that extend transversely through the substrate 16, adjacent its side edge 22, and contact the ground plane 30 as shown. As in the case of the copper plating of the substrate side edge 22, and adjacent peripheral portions of the substrate sides 18 and 20, the snap-on TEM shield 62 serves to trap TEM wave radiation originating at this substrate side edge portion and efficiently return it to its emitting source(s) via a shortened-length RF loop.

Figure 8:
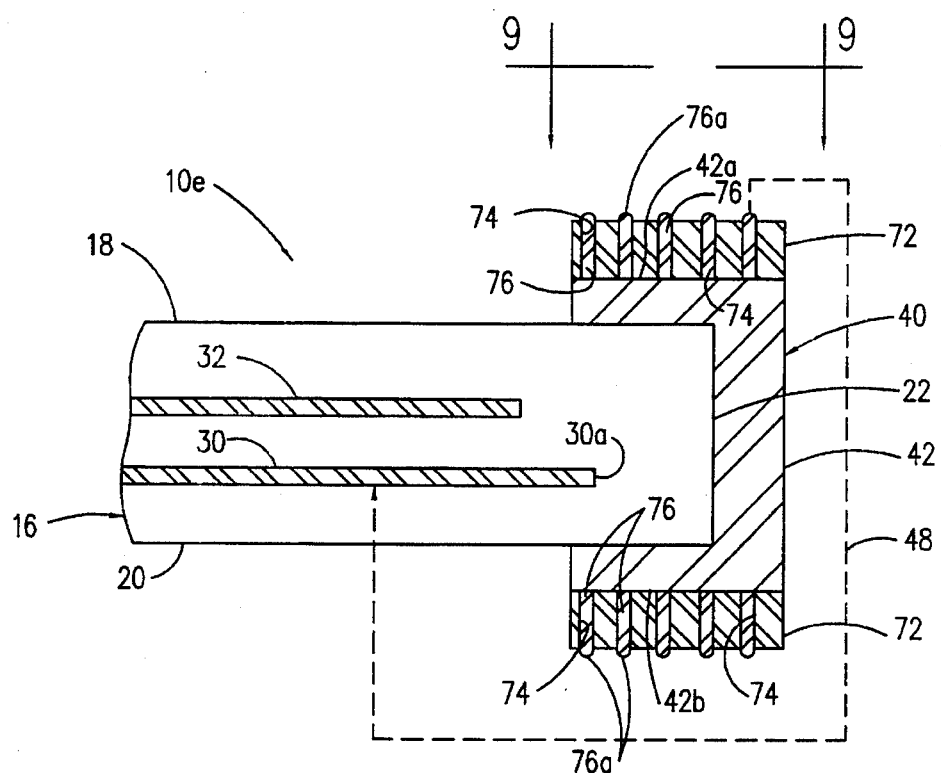
FIG. 8 is a simplified partial cross-sectional view through a fourth alternate embodiment of the edge-shielded printed circuit board.
Figure 9:
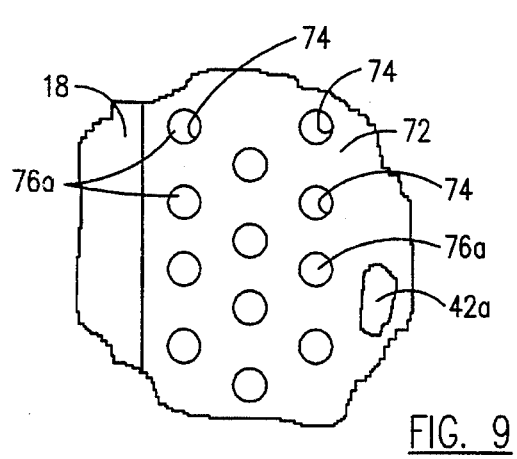
FIG. 9 is a partially cut away top plan view of a portion of the FIG. 8 printed board taken along line 9—9 of FIG. 8.

A fourth alternate embodiment 10e of the previously described circuit board 10a is shown in FIGS. 8 and 9. The circuit board 10e has a substrate portion 16 with top and bottom sides 18 and 20, an edge portion 22, a ground plane 30 with a side edge 30a that stops short of the substrate side edge 22, a power plane 30, and a copper plating TEM shield 40 having a base portion 42 that covers the substrate side edge 22 and transverse outer edge portions 42a,42b that extend along peripheral portions of the substrate sides 18,20 adjacent the substrate side edge 22.

As is well known, the contact efficiency of exposed copper surfaces, such as the outer side surfaces of the TEM shield side portions 42a,42b, tends to degrade as the exposed copper surfaces experience corrosion. In the circuit board 10e, the outer side surfaces of the shield portions 42a,42b are protected by plastic masking material sheets 72 placed thereon after the illustrated side edge portion of the substrate 16 is copper plated to form the TEM shield structure 40.

Each of the masking material sheets 72 has a spaced series of circular holes 74 therein. After the sheets 72 are in place, a suitable soldering surface is used to fill the masking sheet holes with an electrically conductive solder material 76 in a manner forming, along the outer side surfaces of the masking sheets 72, spaced series of outwardly projecting solder bumps 76a. After the soldering process, the masking sheets 72 are left in place, and the series of outwardly projecting solder bumps 76a form the contact areas for grounding the TEM shield structure 40 to the ground plane via the schematically depicted dashed line external grounding path. This external grounding path may be created in a manner similar to that shown in FIG. 6.

Specifically, the masked TEM shield edge portion of the circuit board 10e may be inserted into a support channel portion 44a of a metal chassis 44 (see FIG. 6), and a metal mounting screw 62, a solder-lined via 52, and a chassis mounting boss portion 44b may be used as shown in FIG. 6 to complete the grounding path from the TEM shield 40 to the circuit board ground plane 30. In this case, of course, the solder bumps 76a would contact the interior side surface of the support channel portion 44a instead of the outer side surfaces of the shield portions 42a,42b.

The foregoing detailed description is to be clearly understood as being given by way of illustration and example only, the spirit and scope of the present invention being limited solely by the appended claims.

What is claimed is:

1. Circuit board apparatus comprising:

a substrate structure having first and second opposite sides, and a side edge portion extending between said first and second opposite sides;

a ground plane disposed within said substrate structure in a parallel relationship with said first and second opposite sides;

a power plane disposed within said substrate structure in a spaced apart, parallel, facing relationship with said ground plane, said circuit board apparatus, during operation thereof, creating transverse electromagnetic mode wave radiation between said ground and power planes; and shield means, exteriorly carried by said substrate structure and having a body portion facing said side edge portion of said substrate structure, for intercepting transverse electromagnetic mode radiation passing outwardly through said side edge portion of said substrate structure, said body portion being groundable to said ground plane to conductively return the intercepted radiation thereto.

2. The circuit board apparatus of claim 1 wherein:

said body portion of said shield means is a metallic coating extending along and covering said side edge portion of said substrate structure.

3. The circuit board apparatus of claim 2 wherein:

said ground plane has an edge portion conductively engaged with said metallic coating.

4. The circuit board apparatus of claim 2 wherein:

said metallic coating further extends inwardly from said substrate structure side edge portion along peripheral portions of said first and second opposite sides of said substrate structure.

5. The circuit board apparatus of claim 1 further comprising:

grounding means for electrically coupling said shield means to said ground plane.

6. The circuit board apparatus of claim 5 wherein said grounding means include:

an electrical filter structure, and means for grounding said shield means to said ground plane through said electrical filter structure.

7. The circuit board apparatus of claim 6 wherein said means for grounding said shield means to said ground plane through said electrical filter structure include:

a via extending transversely through said substrate structure between said first and opposite sides thereof, said via having a metallic coating disposed on the interior surface thereof and engaging said ground plane, and electrically conductive lead means for interconnecting said electrical filter structure between said shield means and said via.

8. The circuit board apparatus of claim 1 wherein:

said shield means include a resilient metal shield structure having a central section defining said shield means body portion and having opposite edge portions extending away therefrom in a direction generally transverse thereto, and said circuit board apparatus further comprises:

first means, extending exteriorly along said first and second opposite sides of said substrate structure inwardly adjacent said side edge portion, for conductively engaging and removably supporting said opposite edge portions of said of said resilient metal shield structure in a manner positioning said body portion in an outwardly spaced, facing relationship with said side edge portion of said substrate structure, and second means, extending through said substrate structure between said first and second opposite sides thereof, for electrically coupling said first means to said ground plane.

9. The circuit board apparatus of claim 8 wherein:

said first means include spaced pairs of electrically conductive ground runner structures extending along said first and second opposite sides of said substrate structure and configured to be releasably engaged by said opposite edge portions of said resilient metal shield structure, and said second means include a metallically coated via extending through said substrate structure and electrically coupling said ground plane to said spaced pairs of electrically conductive ground runner structures.

10. The circuit board apparatus of claim 1 wherein:

said body portion of said shield means is a metallic coating extending along and covering said side edge portion of said substrate structure, said metallic coating has additional portions extending inwardly from said substrate structure side edge portion along peripheral portions of said first and second opposite sides of said substrate structure, said additional metallic coating portions having outer side surfaces, and said circuit board apparatus further comprises:

masking material extending along and covering said outer side surfaces of said additional metallic coating portions, said masking material having outer side surfaces and spaced series of holes extending inwardly therethrough to said outer side surfaces of said additional metallic coating portions, and a solder material disposed in said spaced series of holes and forming spaced series of solder bumps projecting outwardly beyond said outer side surfaces of said masking material.

11. A method of shielding transverse electromagnetic mode radiation being emitted from a side edge portion of a circuit board substrate member having a ground plane disposed therein and extending parallel to first and second opposite sides thereof, said method comprising the steps of:

supporting an electrically conductive radiation shield structure on the substrate member, the supported radiation shield structure having a body portion disposed in a facing, adjacent relationship with the substrate member side edge portion to intercept transverse electromagnetic mode radiation emitted therefrom; and grounding said shield structure body portion to the substrate member ground plane.

12. The method of claim 11 wherein:

said supporting step is performed by plating the side edge portion of the substrate member with a metallic material.

13. The method of claim 12 wherein:

said plating step is performed in a manner continuing said metallic material exteriorly along peripheral portions of the first and second sides of the substrate member adjacent the side edge portion thereof.

14. The method of claim 13 wherein:

said plating step is performed using copper.

15. The method of claim 12 wherein:

said grounding step includes the step of positioning a side edge portion of the ground plane at the side edge portion of the substrate member in a manner such that the performance of said plating step places said metallic material in direct contact with the side edge portion of the ground plane.

16. The method of claim 11 wherein:

said radiation shield structure body portion has a pair of side edge portions extending generally transversely thereto, said supporting step includes the steps of exteriorly extending ground runner structures along the first and second opposite sides of the substrate member, and resiliently and removably connecting said side edge portions of said radiation shield structure to said ground runner structures in a manner positioning said radiation shield structure body portion in an outwardly spaced, facing relationship with the side edge portion of the substrate member, and said grounding step includes the step of electrically coupling said ground runner structures to the substrate member ground plane.

17. The method of claim 16 wherein:

said electrically coupling step includes the steps of extending a metallically lined via through the substrate member, and electrically coupling said via to the substrate member ground plane and to said ground runner structures.

18. The method of claim 11 wherein:

said grounding step is performed by grounding said shield structure body portion to the substrate member ground plane through an electrical filter structure.

19. The method of claim 11 wherein:

said supporting step is performed by plating the side edge portion of the substrate member, and adjacent peripheral portions of the first and second opposite sides of the substrate member, with a metallic material, and said method further comprises the steps of:

attaching masking material to the outer side surfaces of the portions of the metallic material extending along the first and second opposite sides of the substrate member, the masking material having spaced apart holes therein, each hole extending outwardly through the opposite sides of the masking material, and disposing solder in the masking material holes in a manner forming solder bumps projecting outwardly beyond the outer side surfaces of the masking material.

20. The method of claim 19 wherein:

said grounding step is performed by forming an electrical grounding path extending from said solder bumps to the substrate member ground plane.

\* \* \* \* \*